United States Patent
Plößl

(10) Patent No.: US 8,367,438 B2
(45) Date of Patent: Feb. 5, 2013

(54) METHOD FOR PRODUCING AN OPTOELECTRONIC SEMICONDUCTOR COMPONENT AND OPTOELECTRONIC SEMICONDUCTOR COMPONENT

(75) Inventor: Andreas Plößl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 32 days.

(21) Appl. No.: 13/122,578

(22) PCT Filed: Sep. 8, 2009

(86) PCT No.: PCT/DE2009/001269
§ 371 (c)(1),
(2), (4) Date: Apr. 18, 2011

(87) PCT Pub. No.: WO2010/040331
PCT Pub. Date: Apr. 15, 2010

(65) Prior Publication Data
US 2011/0186953 A1    Aug. 4, 2011

(30) Foreign Application Priority Data
Oct. 6, 2008  (DE) .................. 10 2008 050 573

(51) Int. Cl.
*H01L 21/00* (2006.01)
(52) U.S. Cl. ............... 438/28; 438/23; 438/24; 438/25; 438/26; 438/27; 438/29; 257/79; 257/98; 257/99; 257/100
(58) Field of Classification Search .............. 438/23, 438/24, 25, 26, 27, 28, 29; 257/79, 98, 99, 257/100
See application file for complete search history.

(56) References Cited

U.S. PATENT DOCUMENTS

| | | | |
|---|---|---|---|
| 5,972,157 A | 10/1999 | Xue et al. | |
| 6,929,966 B2 | 8/2005 | Illek et al. | |
| 7,105,857 B2* | 9/2006 | Nagahama et al. | 257/86 |
| 7,208,334 B2* | 4/2007 | Asakawa et al. | 438/29 |
| 7,588,998 B2 | 9/2009 | Fehrer et al. | |
| 7,598,529 B2 | 10/2009 | Ploessl et al. | |
| 7,880,177 B2* | 2/2011 | Takeuchi et al. | 257/79 |
| 2002/0017652 A1 | 2/2002 | Illek et al. | |
| 2005/0199885 A1* | 9/2005 | Hata et al. | 257/79 |
| 2006/0006398 A1* | 1/2006 | Hata | 257/94 |
| 2006/0097354 A1* | 5/2006 | Ogihara et al. | 257/613 |
| 2006/0237735 A1* | 10/2006 | Naulin et al. | 257/98 |
| 2007/0292979 A1* | 12/2007 | Hata et al. | 438/22 |
| 2008/0230789 A1 | 9/2008 | Onushkin et al. | |
| 2009/0173952 A1* | 7/2009 | Takeuchi et al. | 257/79 |

FOREIGN PATENT DOCUMENTS

| | | |
|---|---|---|
| DE | 100 59 532 A1 | 6/2002 |
| DE | 103 07 280 A1 | 6/2004 |
| DE | 10 2005 029 246 A1 | 10/2006 |
| EP | 2 063 468 A1 | 5/2009 |
| JP | 7-106631 A | 4/1995 |
| WO | 03/065420 A2 | 8/2003 |
| WO | 2008/044769 A1 | 4/2008 |

* cited by examiner

*Primary Examiner* — Marcos D. Pizarro
*Assistant Examiner* — Bilkis Jahan
(74) *Attorney, Agent, or Firm* — DLA Piper LLP (US)

(57) ABSTRACT

An optoelectronic semiconductor component includes a semiconductor body connected to a main area of a carrier body by a solder layer, wherein sidewalls of the semiconductor body are provided with a dielectric layer, and a mirror layer applied to the dielectric layer.

9 Claims, 7 Drawing Sheets

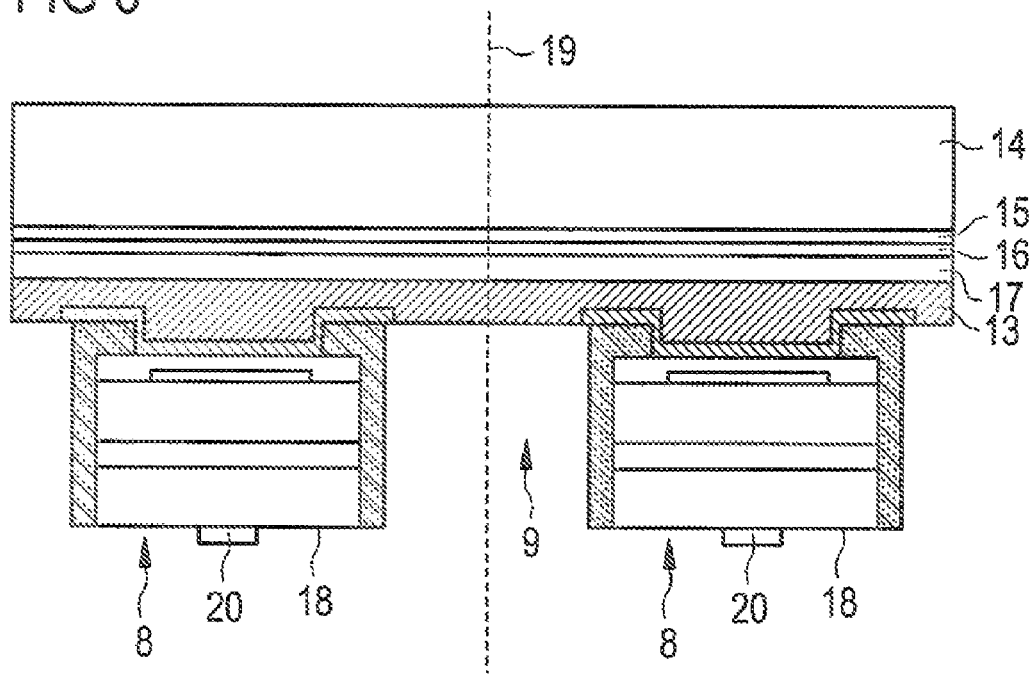
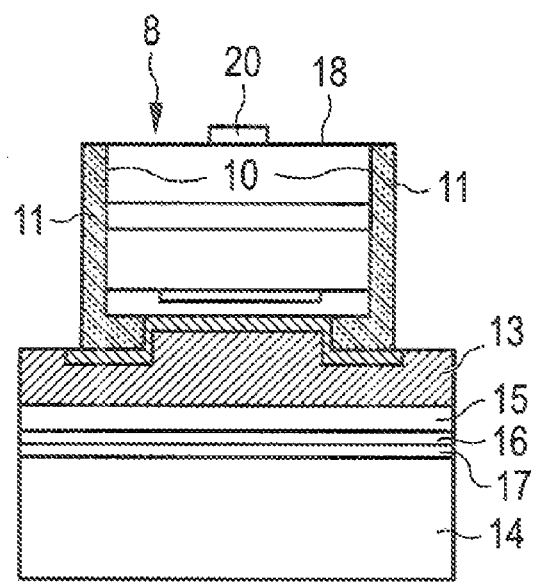

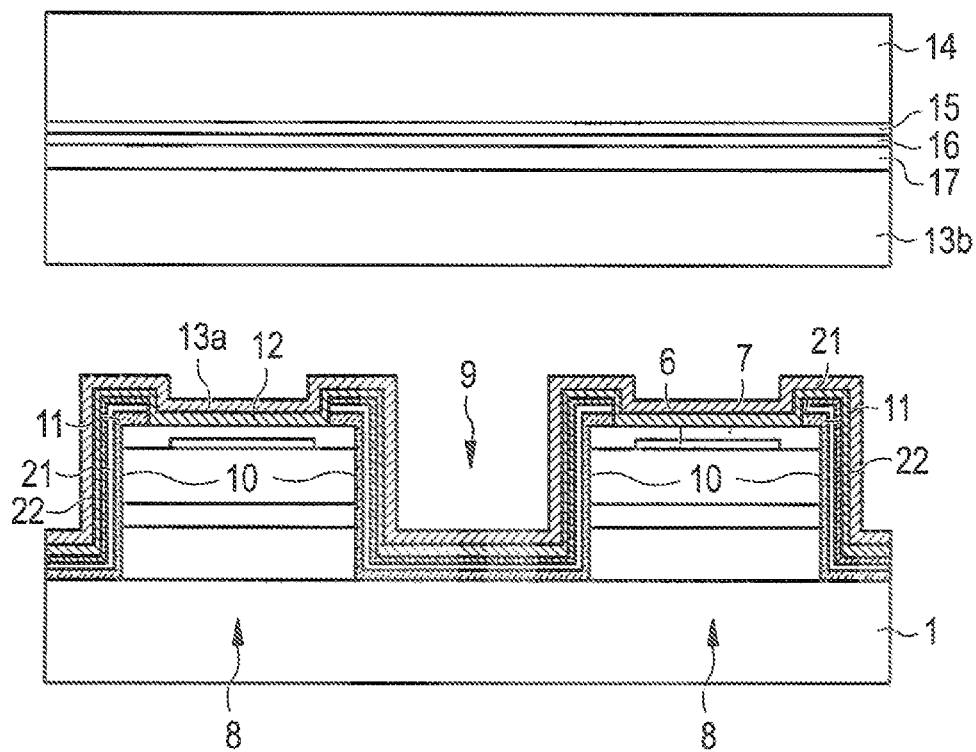

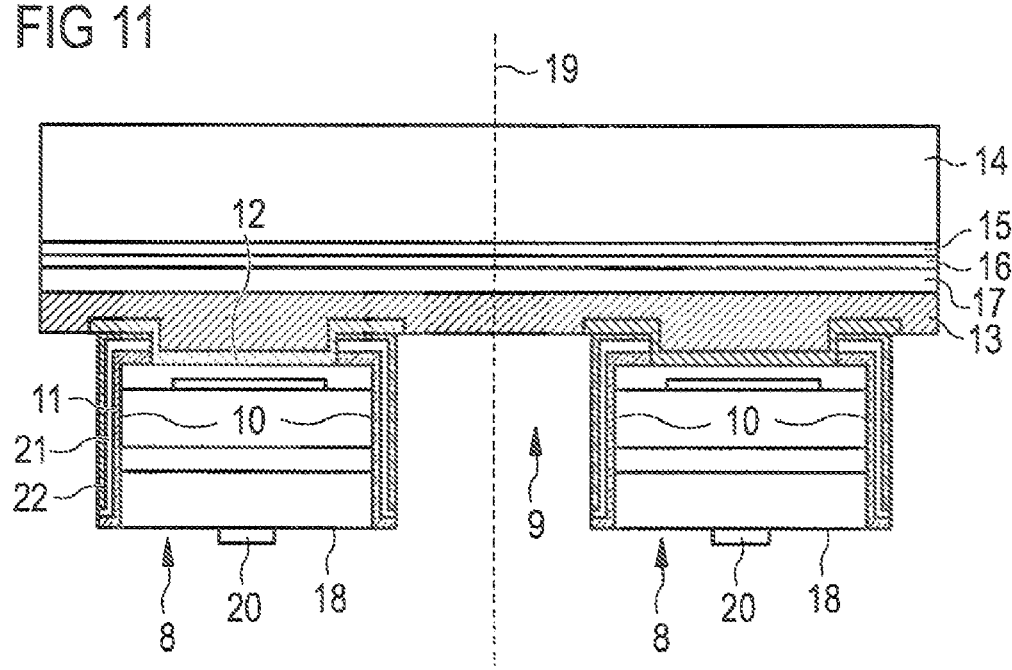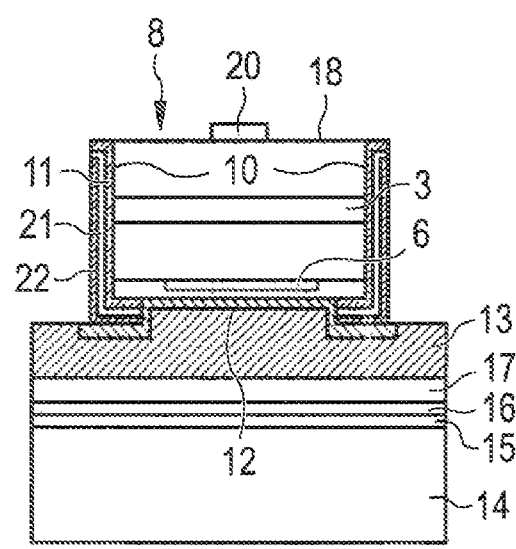

METHOD FOR PRODUCING AN OPTOELECTRONIC SEMICONDUCTOR COMPONENT AND OPTOELECTRONIC SEMICONDUCTOR COMPONENT

RELATED APPLICATIONS

This is a §371 of International Application No. PCT/DE2009/001269, with an international filing date of Sep. 8, 2009 (WO 2010/040331 A1, published Apr. 15, 2010), which is based on German Patent Application No. 10 2008 050 573.0, filed Oct. 6, 2008, the subject matter of which is incorporated by reference.

TECHNICAL FIELD

This disclosure relates to a method for producing an optoelectronic semiconductor component, and to an optoelectronic semiconductor component.

BACKGROUND

WO 03/065420 discloses a method for producing an optoelectronic semiconductor component, wherein an epitaxial layer sequence is grown onto a growth substrate, the epitaxial layer sequence is connected at a side lying opposite the growth substrate to a carrier body by means of a solder layer, and the growth substrate is subsequently detached from the epitaxial layer sequence. A so-called "thin-film semiconductor" component produced in this way has the advantage that a cost-effective material having good thermal and electrical properties can be chosen as material for the carrier body, without having to satisfy the stringent stipulations with regard to the crystal structure and the lattice constant that are imposed on a growth substrate. Furthermore, the method has the advantage that the generally expensive growth substrate, for example, a GaN or sapphire substrate for growing a nitride compound semiconductor, can be reused.

DE 10 2005 029 246 A1 discloses a suitable soldering layer sequence with which a semiconductor chip can be connected to a carrier body.

It could thus be helpful to provide an improved method for producing an optoelectronic semiconductor component and an optoelectronic semiconductor component which is distinguished by improved optical and/or mechanical properties.

SUMMARY

I provide a method for producing an optoelectronic semiconductor component including growing an epitaxial layer sequence onto a growth substrate, applying a contact layer and a subsequent barrier layer to a surface of the epitaxial layer sequence which is remote from the growth substrate, structuring the epitaxial layer sequence to form individual semiconductor bodies by producing trenches in the epitaxial layer sequence, applying a dielectric layer at least to sidewalls of the semiconductor bodies which are uncovered in the trenches, applying a first part of a solder layer to the semiconductor bodies and into the trenches between the semiconductor bodies, applying a second part of the solder layer to a carrier body, connecting the semiconductor bodies at a side remote from the growth substrate to the carrier body by the solder layer, wherein the first part and the second part fuse together and the trenches between the semiconductor bodies are filled by the solder layer, and detaching the growth substrate.

I also provide an optoelectronic semiconductor component including a semiconductor body connected to a main area of a carrier body by a solder layer, wherein sidewalls of the semiconductor body are provided with a dielectric layer, and a mirror layer applied to the dielectric layer.

BRIEF DESCRIPTION OF THE DRAWINGS

FIG. 6 shows a schematic illustration of a cross section through the composite assembly composed of the carrier body and the semiconductor bodies after the removal of the solder layer in an intermediate step of the first example of the method.

FIG. 7 shows a schematic illustration of an optoelectronic semiconductor component in accordance with the first example.

FIG. 8 shows a schematic illustration of a cross section through the carrier body and the growth substrate with the semiconductor bodies arranged thereon in an intermediate step of a second example of the method.

FIG. 11 shows a schematic illustration of a cross section through the composite assembly composed of the carrier body and the semiconductor bodies after the removal of the solder layer in an intermediate step of the second example of the method.

FIG. 12 shows a schematic illustration of an optoelectronic semiconductor component in accordance with the second example.

DETAILED DESCRIPTION

Figure 1:
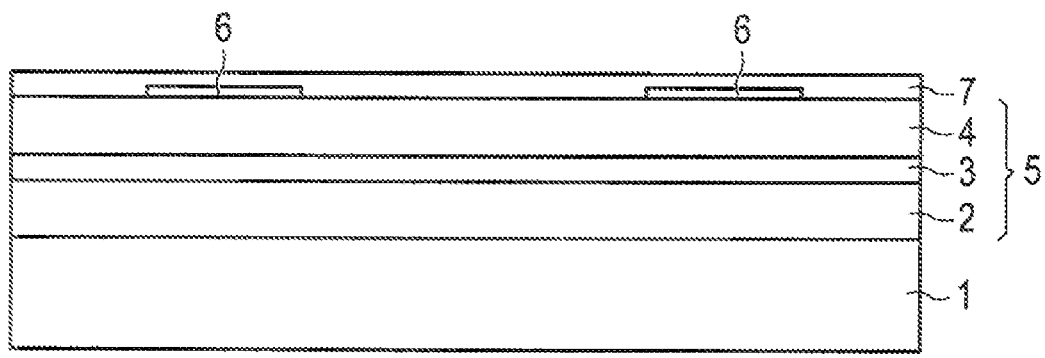
FIG. 1 shows a schematic illustration of a cross section through the growth substrate with the layers applied thereto in an intermediate step of a first example of the method.

In the method for producing an optoelectronic semiconductor component, an epitaxial layer sequence is first grown onto a growth substrate.

The epitaxial layer sequence is preferably based on a nitride compound semiconductor. "Based on a nitride compound semiconductor" means that the semiconductor layer sequence or at least one layer thereof comprises a III nitride compound semiconductor material, preferably $In_xAl_yGa_{1-x-y}N$, where $0 \leq x \leq 1$, $0 \leq y \leq 1$ and $x+y \leq 1$. In this case, this material need not necessarily have a mathematically exact composition according to the above formula. Rather, it can comprise one or a plurality of dopants and additional constituents which substantially do not change the characteristic physical properties of the $In_xAl_yGa_{1-x-y}N$ material. For the sake of simplicity, however, the above formula only includes the essential constituents of the crystal lattice (In, Al, Ga, N), even if these can be replaced in part by small amounts of further substances.

The epitaxial layer sequence of the optoelectronic semiconductor component contains, on a side facing the growth substrate, for example, an n-type region comprising one or a plurality of n-doped layers. On a side remote from the growth substrate, the epitaxial layer sequence contains a p-type region containing one or a plurality of p-doped layers. The n-type region and the p-type region can in each case also contain one or a plurality of undoped layers.

An active layer is preferably arranged between the n-type region and the p-type region, which active layer can be, in particular, a radiation-emitting layer of an LED or of a semiconductor laser. The active layer can be embodied, for example, as a pn junction, as a double heterostructure, as a single quantum well structure or multiple quantum well structure. In this case, the designation quantum well structure encompasses any structure in which charge carriers experience a quantization of their energy states as a result of confinement. In particular, the designation quantum well structure does not comprise any indication about the dimensionality of the quantization. It therefore encompasses, inter alia, quantum wells, quantum wires and quantum dots and any combination of these structures.

In the case of an epitaxial layer sequence composed of a nitride compound semiconductor material, the growth substrate can be, in particular, a sapphire substrate or alternatively a GaN substrate.

After the epitaxial layer sequence has been grown onto the growth substrate, preferably a contact layer, in particular a reflective contact layer, is applied to the epitaxial layer sequence. The contact layer serves for electrically connecting the semiconductor material, in particular for producing an ohmic contact with the semiconductor material. The contact layer can contain or consist of, in particular, Al, Ag, Au or Pt. The contact layer can be structured photolithographically, if appropriate.

A barrier layer is preferably applied to the contact layer. The barrier layer has the function, in particular, of preventing diffusion of the material of a subsequently applied solder layer into the contact layer.

In a subsequent method step, the epitaxial layer sequence is structured to form individual semiconductor bodies by trenches being produced in the epitaxial layer sequence. The epitaxial layer sequence is preferably completely severed by the trenches, that is to say that the trenches extend from that surface of the epitaxial layer sequence which lies opposite the growth substrate, including the contact layer and barrier layer applied thereto, as far as the growth substrate.

The trenches can be produced by an etching process, for example.

The semiconductor bodies separated by the trenches in each case have sidewalls which adjoin the trenches. In a further method step, a dielectric layer is applied at least to the sidewalls of the semiconductor bodies which are uncovered in the trenches. The dielectric layer can, in particular, also cover the growth substrate uncovered in the trenches. By way of example, the dielectric layer is firstly applied over the whole area to the composite assembly composed of the growth substrate and the semiconductor bodies, such that the dielectric layer covers the semiconductor bodies with the contact layer and the barrier layer applied thereto, the sidewalls of the semiconductor bodies and the growth substrate uncovered in the trenches. To enable the semiconductor bodies to be electrically connected, the dielectric layer is preferably structured in such a way that it has an opening in the region of the previously applied barrier layer.

The dielectric layer is preferably a silicon nitride layer, for example. in a non-stoichiometric composition $SiN_x$, or a silicon oxide, for example, $SiO_2$ or $SiO_2:P_2O_5$.

In one configuration, after the dielectric layer has been applied and, if appropriate, structured, an adhesion promoter and/or wetting layer is applied to the dielectric layer. The adhesion promoter and/or wetting layer has the function of improving the adhesion and/or the wetting of a solder layer succeeding the dielectric layer. The adhesion promoter and/or wetting layer can contain or consist of, in particular, Ti.

Afterward, a first part of a solder layer is applied to the semiconductor bodies and in the trenches between the semiconductor bodies. The first part of the solder layer is preferably applied over the whole area to the composite assembly composed of the growth substrate, the semiconductor bodies and the layers already applied previously. The first part of the solder layer therefore runs over the semiconductor bodies, over the sidewalls of the semiconductor bodies and in the trenches between the semiconductor bodies over the previously applied layers.

The first part of the solder layer need not necessarily be an individual layer, rather it can also be a layer system composed of a plurality of solder constituents. By way of example, the solder layer can comprise, proceeding from the adhesion promoter and/or wetting layer arranged underneath, an Sn layer, a Ti layer and an Au layer. The Sn layer constitutes a first component of the solder with which the semiconductor bodies are subsequently connected to a carrier body. The succeeding Ti layer forms a barrier layer, and the Au layer serves as an oxidation protection layer. The barrier layer composed of Ti that is arranged between the oxidation protection layer composed of Au and the Sn layer prevents diffusion of Sn into the subsequent Au layer.

A second part of a solder layer is applied to a carrier body which is intended later to be connected to the semiconductor bodies. By way of example, the carrier body can be a germanium carrier body. The second part of the solder layer can comprise Au, in particular. One or a plurality of intermediate layers can be arranged between the carrier and the second part of the solder layer.

In particular, a contact layer can be applied to the carrier, which contact layer for example electrically connects the semiconductor material of a germanium carrier to the subsequent metal layers. As on the semiconductor bodies, an adhesion promoter and/or wetting layer can be arranged onto the contact layer. By way of example, this can involve a layer system composed of a Pt layer and an Sn layer.

The semiconductor bodies are subsequently connected at a side remote from the growth substrate to the carrier body by the solder layer.

During the soldering process, the first part of the solder layer, which is applied to the composite assembly composed of the growth substrate and the semiconductor bodies, and the second part of the solder layer, which is applied to the carrier body, fuse together. By way of example, the first part of the solder layer can contain Sn and the second part of the solder layer can contain Au, wherein the first part of the solder layer and the second part of the solder layer fuse to form an AuSn compound during the soldering process.

During the soldering process, the trenches between the semiconductor bodies are filled by the solder layer. The amounts of the first part of the solder layer and of the second part of the solder layer are therefore dimensioned in such a way that during the soldering process enough solder material is formed that the trenches between the semiconductor bodies can be completely filled. After the soldering process, the semiconductor bodies are advantageously connected at a side lying opposite the growth substrate to the carrier body. By virtue of the fact that the trenches originally present between the semiconductor bodies are completely filled by the solder layer, the composite assembly thus produced has no cavities between the semiconductor bodies.

In a further method step, the growth substrate is detached from the semiconductor bodies. The growth substrate is preferably detached by means of a laser lift-off method, which can be employed, in particular, if the growth substrate is a sapphire substrate. During the laser lift-off method, the semiconductor material is irradiated with laser radiation through the substrate, wherein the absorption of the laser radiation is significantly greater in the semiconductor layer than in the substrate. The laser radiation is absorbed on account of the high absorption in the semiconductor material near-interfacially in the semiconductor layer and leads there to a material decomposition that separates the semiconductor bodies from the growth substrate.

During the detachment of the growth substrate, the composite assembly composed of the carrier body and the semiconductor bodies is advantageously stabilized by the solder layer that fills the trenches between the semiconductor bodies. In particular, the dielectric layer applied at least to the sidewalls of the semiconductor bodies is stabilized and protected by the solder layer during the process of detaching the growth substrate.

In one preferred configuration of the method, after the process of applying the dielectric layer and, in particular, before the process of applying an adhesion promoter and/or wetting layer and/or the subsequent solder layer, a mirror layer is applied to the dielectric layer. The mirror layer can comprise, in particular, a metal or a metal compound. By way of example, the mirror layer can contain or consist of Ag, Pt, Al or Rh. Like the dielectric layer applied previously, the mirror layer runs at least over the sidewalls of the semiconductor bodies. The dielectric layer insulates the mirror layer from the sidewalls of the semiconductor bodies and prevents a short circuit between the n-type region and the p-type region of the semiconductor bodies. In the completed optoelectronic semiconductor components, the mirror layer on the dielectric layer has the advantage that the radiation emitted by the radiation-emitting active layer in the direction of the sidewalls of the semiconductor bodies is reflected back and coupled out at a radiation exit side if appropriate after one or a plurality of further reflections in the semiconductor body. The coupling-out of radiation at the radiation exit side is thus increased.

The improvement in the coupling-out of radiation by virtue of the mirror layer in the region of the sidewalls of the semiconductor bodies is particularly effective if the sidewalls of the semiconductor bodies which are produced by the etching process are inclined, i.e., are etched obliquely and, in particular, not perpendicularly to the original growth substrate.

After the mirror layer has been applied, preferably a protective layer is applied to the mirror layer before, for example, the adhesion promoter and/or wetting layer and the subsequent solder layer are applied. The protective layer protects the mirror layer against interactions with the subsequent layers, in particular the solder layer. The protective layer can be, in particular, a dielectric layer composed of a silicon nitride or a silicon oxide. By way of example, the protective layer can be formed from the same material as the previously applied dielectric layer on which the mirror layer is arranged. However, the protective layer need not necessarily be electrically insulating, such that it can, for example, also comprise a metal or a metal compound such as, for example, TiW:N, Ti or Ni.

In one configuration of the method, the solder layer is removed from the trenches between the semiconductor bodies after the growth substrate has been detached. The solder layer can be removed from the trenches between the semiconductor bodies in particular by means of an etching process which is effected from the side which lies opposite the carrier body, i.e., the side of the original growth substrate.

In another advantageous configuration, the solder layer remains in the trenches between the semiconductor chips, and is therefore not removed, after the growth substrate has been detached. In this case, the semiconductor chips with the layers applied thereto are protected and stabilized at the sidewalls, in particular, by the solder layer. Furthermore, by virtue of the fact that the trenches are filled by the solder layer, further process steps can be facilitated, for example, resist coating processes in photolithography.

In the trenches between the individual semiconductor bodies, the composite assembly composed of the carrier body with the applied semiconductor bodies can subsequently be separated to form individual semiconductor components. In this way, it is possible to produce semiconductor components which contain one or a plurality of semiconductor bodies. If the solder layer was not removed from the trenches beforehand, it advantageously protects the epitaxial layer sequence against mechanical damage during the mounting of the semiconductor chips.

The method described above can be used to produce, in particular, an optoelectronic semiconductor component comprising at least one semiconductor body connected to a main area of a carrier body by a solder layer, wherein the sidewalls of the semiconductor body which run obliquely or perpendicularly with respect to the main area of the carrier body are provided with a dielectric layer, and a mirror layer is applied to the dielectric layer. The mirror layer has the advantage that radiation emitted in the direction of the sidewalls is reflected back to preferably be coupled out from the semiconductor body at the radiation exit side. In this way, undesired emission in a lateral direction is reduced in favor of intensified emission in a vertical direction.

Further advantageous configurations of the optoelectronic semiconductor component, in particular of the semiconductor body and of the layers applied thereto, arise analogously to the advantageous configurations described in connection with the method.

The optoelectronic semiconductor component is, in particular, free of any growth substrate. The optoelectronic semiconductor component is therefore preferably a so-called "thin-film semiconductor" component in which the epitaxial layer sequence is connected to a carrier body that is not identical with the growth substrate. In particular, the main area of the optoelectronic semiconductor component which lies opposite the carrier body can be the n-side of the epitaxial layer sequence and serve as a radiation coupling-out area. To obtain better coupling-out of radiation, that surface of the semiconductor bodies which lies opposite the carrier body can be structured or roughened.

The method for producing an optoelectronic semiconductor component and the optoelectronic semiconductor component are explained in greater detail below on the basis of examples with reference to FIGS. 1 to 12.

Identical or identically acting constituents are in each case provided with the same reference symbols in the figures. The illustrated constituents and also the size relationships of the constituents among one another should not be regarded as true to scale.

In the intermediate step of a first example of the method for producing an optoelectronic semiconductor component, as illustrated in FIG. 1, an epitaxial layer sequence 5 has been grown onto a growth substrate 1.

The epitaxial layer sequence 5 can be, in particular, a semiconductor layer sequence based on a nitride compound semiconductor. The epitaxial layer sequence 5 has, for example, an n-type region 2 on the side of the growth substrate 1 and a p-type region 4 remote from the growth substrate. The n-type region 2 can contain one or a plurality of n-doped layers and the p-type region 4 can contain one or a plurality of p-doped layers. An active layer 3, in particular a radiation-emitting active layer, is contained between the n-type region 2 and the p-type region 4. The epitaxial layer sequence 5 can in each case also contain one or a plurality of undoped layers in the n-type region 2, in the active layer 3 and in the p-type region 4.

The growth substrate 1 can be, in particular, a wafer composed of sapphire or GaN.

A contact layer 6 has been applied to the epitaxial layer sequence 5, the contact layer already having been structured to later form electrical contacts for individual semiconductor bodies. The contact layer 6 is preferably a mirroring contact layer which contains or consists of, for example, Al, Ag or Au. The metallic contact layer 6 forms an electrical connection to the semiconductor material of the p-type region 4 and is advantageously reflective to the radiation emitted by the active layer 3 to reflect radiation emitted in the direction of the contact in the direction of the radiation exit side, wherein the radiation exit side, as will be explained below, is arranged at the side of the original growth substrate 1 in the finished optoelectronic semiconductor component.

A barrier layer 7 is applied to the contact layer 6. The barrier layer 7 serves, in particular, as a diffusion barrier to protect the contact layer 6 against the diffusion of constituents of subsequently applied layers, in particular of a solder layer. In particular, a TiW:N layer is suitable as the barrier layer 7.

Figure 2:
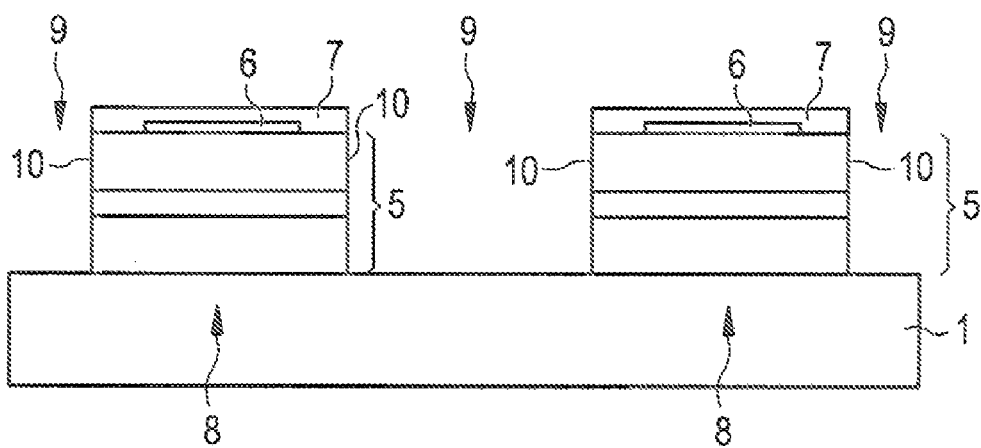
FIG. 2 shows a schematic illustration of a cross section through the growth substrate with the semiconductor bodies arranged thereon in an intermediate step of the first example of the method.

In the intermediate step of the method as illustrated in FIG. 2, the epitaxial layer sequence 5 has been structured to form individual semiconductor bodies 8. In this case, trenches 9 have been produced in the epitaxial layer sequence 5, the trenches extending from that side of the epitaxial layer sequence 5 which lies opposite the growth substrate 1, including the contact layer 6 and barrier layer 7 applied thereto, as far as the growth substrate 1. The trenches can be produced by an etching method, for example.

The sidewalls 10 of the semiconductor bodies 8 are uncovered in the trenches 9. The sidewalls 10 need not necessarily run perpendicularly to the growth substrate 1, as illustrated in FIG. 2, but rather can in particular also run obliquely with respect to the growth substrate.

Figure 3:
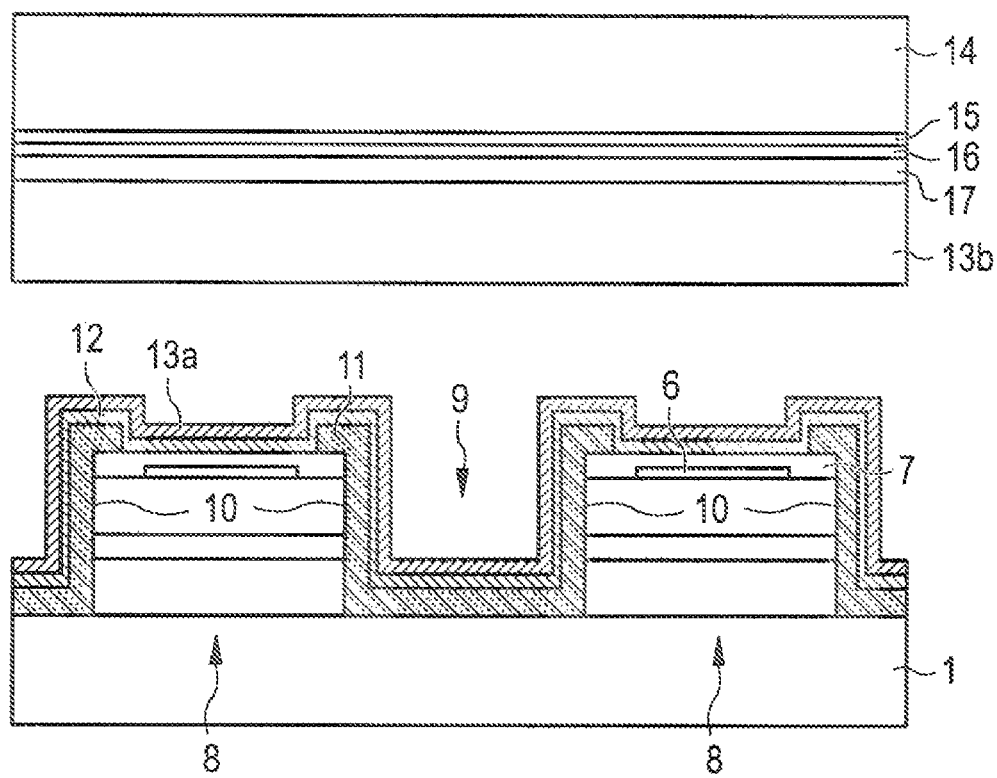
FIG. 3 shows a schematic illustration of a cross section through the carrier body and the growth substrate with the semiconductor bodies arranged thereon in an intermediate step of the first example of the method.

In the intermediate step of the method as illustrated in FIG. 3, a dielectric layer 11 has been applied to the semiconductor bodies 8. The dielectric layer 11 runs, in particular, over the sidewalls 10 of the semiconductor bodies 8 and electrically insulates the latter from subsequently applied further layers. The dielectric layer 11 has been structured in such a way that at least one partial region of that surface of the semiconductor bodies 8 which is remote from the growth substrate 1 is free of the dielectric layer 11 to enable the semiconductor bodies 8 provided with the contact layer 6 and the barrier layer 7 to be electrically connected to further electrically conductive layers. As illustrated in FIG. 3, the dielectric layer 11 extends from an edge region of the semiconductor bodies 8 over the sidewalls 10 of the semiconductor bodies 8 and also covers the growth substrate 1 in the trenches 9 between the semiconductor bodies 8. The dielectric layer 11 can be, in particular, a silicon nitride layer, in particular in a non-stoichiometric composition $SiN_x$, or a silicon oxide, for example, $SiO_2$ or $SiO_2:P_2O_5$.

A layer 12 serving as an adhesion promoter and/or wetting layer and a first part 13a of a solder layer are applied to the dielectric layer 11. The adhesion promoter and/or wetting layer 12 and the solder layer can in each case be formed from one or a plurality of partial layers. The adhesion promoter and/or wetting layer can contain or consist of, in particular, Ti.

The first part of the solder layer 13a advantageously comprises three partial layers in the order Sn, Ti and Au. To simplify the illustration, these are not illustrated individually in FIG. 3. The Sn partial layer, which follows the adhesion promoter and wetting layer 12, contains Sn as a first component of the solder layer which arises later during the fusing of the first part 13a and of the second part 13b of the solder layer. The partial layer composed of Sn is preferably provided with a diffusion barrier composed of Ti and an oxidation protection layer composed of Au. The oxidation protection layer composed of Au protects the Sn layer against oxidation, wherein the Ti layer arranged between the Sn layer and the Au layer prevents diffusion of Sn into the Au layer.

The adhesion promoter and/or wetting layer 12 and also the first part of the solder layer 13a are preferably arranged on the entire composite assembly composed of the growth substrate 1, the semiconductor bodies 8 and the previously applied layers, that is to say that they cover that region of the barrier layer 7 which is not covered by the dielectric layer 11, and also the dielectric layer 11 on the sidewalls 10 of the semiconductor bodies and in the trenches 9 between the semiconductor bodies 8.

A second part of the solder layer 13b is situated on a carrier body 14, to which the semiconductor bodies 8 are intended to be connected at a side remote from the growth substrate 1.

The second part of the solder layer 13b on the carrier body 14 can be an Au layer, for example. During the later soldering process, the first part of the solder layer 13a on the semiconductor bodies 8 and the second part of the solder layer 13b on the carrier body 14 fuse together to form a solder layer composed of a metal alloy. By way of example, the first part of the solder layer 13a predominantly contains Sn and the second part of the solder layer 13b Au, wherein the two constituents of the solder layer fuse to form an AuSn alloy during the soldering process.

Further layers 15, 16, 17 are preferably arranged between the carrier body 14, which can be a germanium carrier, in particular, and the second part of the solder layer 13b. The carrier body 14 is preferably provided with a contact layer 15 composed of a metal or a metal alloy which produces an electrical contact with the carrier body 14. The contact layer 15 can be followed by an adhesion promoter layer 16 and/or a wetting layer 17. By way of example, the adhesion promoter layer 16 can contain Ti and the wetting layer 17 Pt.

Figure 4:
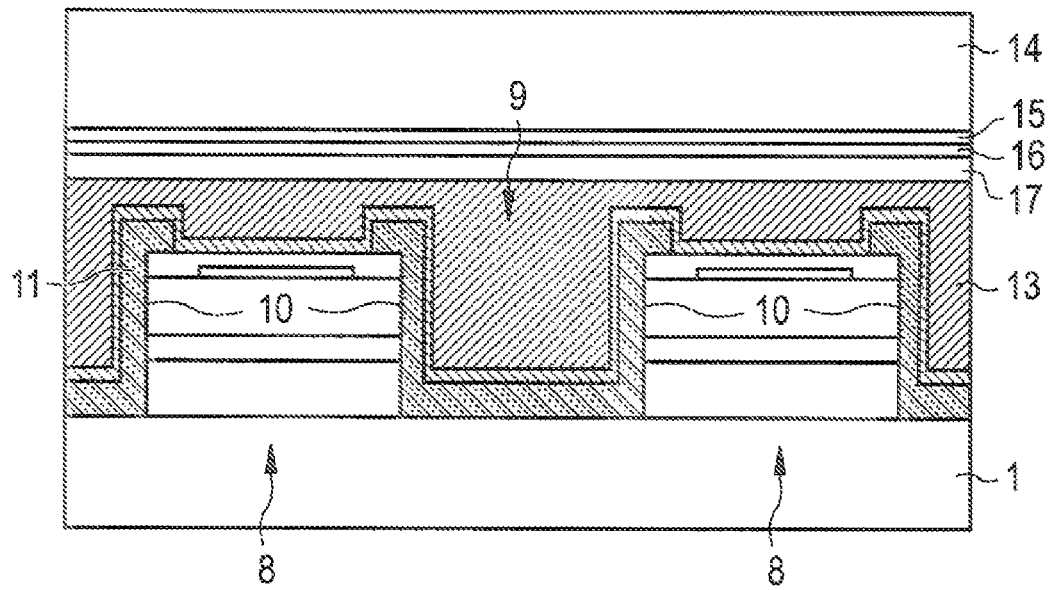
FIG. 4 shows a schematic illustration of a cross section through the composite assembly of the carrier body and the growth substrate with the semiconductor bodies arranged thereon in an intermediate step of the first example of the method.

FIG. 4 shows the composite assembly composed of the carrier body 14 on one side and the growth substrate 1 with the semiconductor bodies 8 on the other side after the soldering process. The first part of the solder layer 13a and the second part of the solder layer 13b have fused to form a solder layer 13.

The solder layer 13 can contain AuSn in particular, but the compound can also contain further components composed of the intermediate layers inserted in the solder layer system, if appropriate, such as Ti, for example.

During the soldering process, the trenches 9 between the semiconductor bodies are advantageously completely filled by the solder layer 13. The layer thicknesses of the previously applied parts of the solder layer are dimensioned such that a sufficiently thick solder layer 13 arises which can completely fill the trenches 9 between the semiconductor chips 8. The filling of the trenches 9 between the semiconductor bodies 8 gives rise to a stable composite assembly of the carrier body 14 and the semiconductor bodies 8, which is advantageous for the subsequent detachment of the growth substrate 1 from the semiconductor bodies 8. Furthermore, a sufficient amount of flowable solder 13 between the carrier 14 and the semiconductor bodies 8 has the advantage that unevennesses possibly present at the joining surfaces can be compensated for. The solder layer 13 in particular also stabilizes the dielectric layer 11 on the sidewalls 10 of the semiconductor bodies 8.

Figure 5:
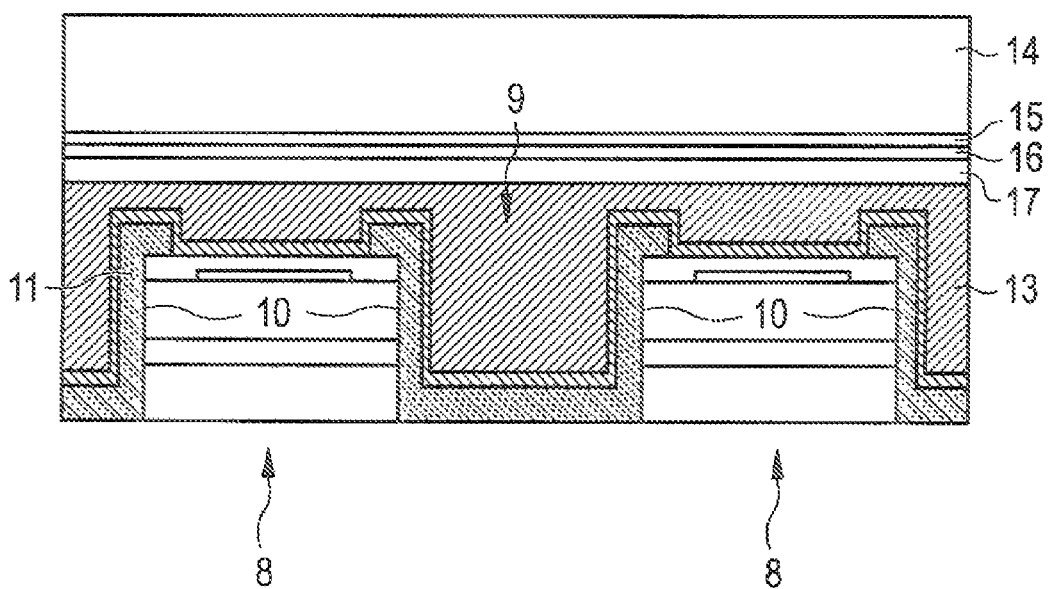
FIG. 5 shows a schematic illustration of a cross section through the composite assembly composed of the carrier body and the semiconductor bodies after the detachment of the growth substrate in an intermediate step of the first example of the method.

In the intermediate step of the method as illustrated in FIG. 5, the growth substrate has been detached from the semiconductor bodies 8. In the case of a growth substrate composed of sapphire, in particular, the detachment can be effected by a laser lift-off method. The laser lift-off method is known per se from WO 03/065420 A2 cited in the introduction and will therefore not be explained in more specific detail. In the case of a growth substrate composed of GaN, the detachment of the growth substrate can be effected, for example, by ion implantation of hydrogen ions and a subsequent thermal treatment.

As illustrated in FIG. 6, the solder layer 13 can be removed from the trenches 9 between the semiconductor bodies 8 after the growth substrate has been detached. The solder layer 13 can be removed by means of an etching process, for example. Alternatively, however, it is also possible for the solder layer 13 not to be removed from the trenches 9 between the semiconductor chips. In this case, the solder layer 13 advantageously acts as a stabilization and protection layer.

Those surfaces 18 of the semiconductor bodies 8 which face the original growth substrate and which serve as radiation coupling-out areas in the completed optoelectronic semiconductor component can be roughened by a further etching process to prevent multiple total reflections within the semiconductor bodies 8 and to improve the coupling-out of radiation in this way. Furthermore, a contact layer 20 can be applied to that surface of the semiconductor bodies 8 which is remote from the carrier body 14 to produce an electrical contact with the n-type region of the semiconductor body 8.

In a further method step, the carrier body 14 with the semiconductor bodies 8 arranged thereon can be singulated by separation along the trenches 9 between the semiconductor chips, as indicated by the dashed line 19 in FIG. 5, to form individual optoelectronic semiconductor components comprising one or a plurality of semiconductor bodies 8.

The optoelectronic semiconductor component completed in this way is illustrated in FIG. 7. The optoelectronic semiconductor component can be, in particular, an LED or a semiconductor laser.

By virtue of the fact that the optoelectronic semiconductor component has no growth substrate, heat generated in the semiconductor body 8 can be effectively dissipated to the carrier body 14. The dielectric layer 11 on the sidewalls of the semiconductor body 8 reduces the risk of short circuits at the sidewalls 10.

In a further example of the method, the first method steps correspond to the method steps explained in connection with FIGS. 1 and 2 and will, therefore, not be described again. FIG. 8 illustrates the carrier body 14 and the growth substrate 1 with the layer systems applied thereto before the soldering process is carried out.

The layer system on the carrier body 14 comprising the contact layer 15, the adhesion layer 16, the wetting layer 17 and the second part of the solder layer 13b, corresponds to the layer system illustrated in FIG. 3.

In this example, the layer system applied to the growth substrate 1 differs from the example illustrated in FIG. 3 in that a mirror layer 21 has been applied to the dielectric layer 11 before the application of the adhesion promoter and/or wetting layer 12 for the first part of the solder layer 13a. The mirror layer 21 is structured like the underlying dielectric layer 11, that is to say that it preferably runs from that surface of the semiconductor bodies 8 which is remote from the growth substrate 1 along the sidewalls 10 of the semiconductor bodies 8 and in the trenches 9 between the semiconductor bodies 8 over the dielectric layer 11.

The mirror layer 21 can contain or consist of, in particular, Ag, Pt, Al and/or Rh. By way of example, it can contain two partial layers composed of Pt and Ag.

A protective layer 22 is applied to the mirror layer 21. The protective layer 22 protects the mirror layer 21 against reaction with one of the subsequent layers and/or diffusion of constituents of the subsequent layers into the mirror layer 21. Like the dielectric layer 11, the protective layer 22 can be, for example, a layer composed of a silicon nitride or a silicon oxide. However, the protective layer 22 can also comprise a metal or a metal alloy. The protective layer 22 is structured like the underlying mirror layer 21 and the underlying dielectric layer 11.

As in the example described in FIG. 3, an adhesion promoter and/or wetting layer 12 and the first part of the solder layer 13a are applied to the protective layer 22.

The method steps illustrated in FIGS. 9, 10 and 11 correspond to FIGS. 4, 5, and 6 described in connection with the first example with regard to their implementation and the advantageous configurations and will therefore not be explained in more specific detail.

Figure 9:
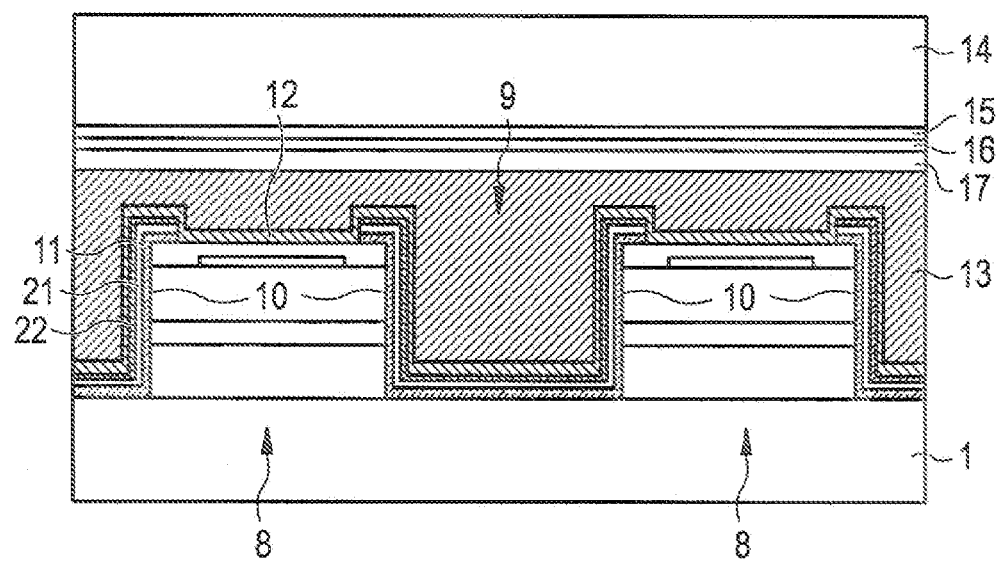
FIG. 9 shows a schematic illustration of a cross section through the composite assembly of the carrier body and the growth substrate with the semiconductor bodies arranged thereon in an intermediate step of the second example of the method.

Thus, in the intermediate step illustrated in FIG. 9, the carrier body 14 is connected to the composite assembly composed of the growth substrate 1 and the semiconductor bodies 8, wherein the first part of the solder layer and the second part of the solder layer fuse to form a solder layer 13 which completely fills the trenches 9 between the semiconductor bodies 8.

Figure 10:
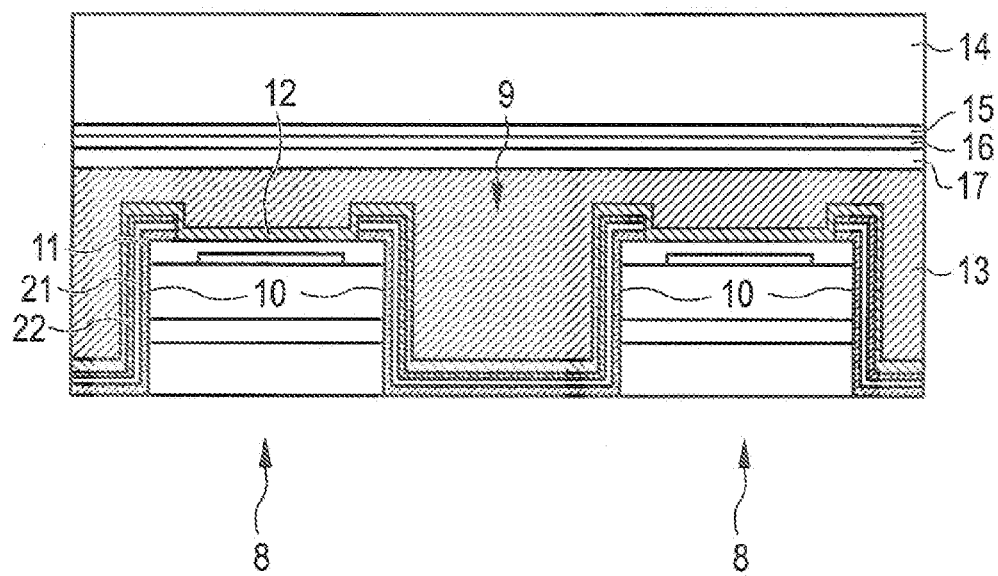
FIG. 10 shows a schematic illustration of a cross section through the composite assembly composed of the carrier body and the semiconductor bodies after the detachment of the growth substrate in an intermediate step of the second example of the method.

In the further intermediate step illustrated in FIG. 10, the growth substrate has been detached from the semiconductor bodies 8.

In a further intermediate step illustrated in FIG. 11, the solder layer 13 is removed from the trenches 9 between the semiconductor bodies 8 and the carrier body 14 is singulated if appropriate by separation along the trenches 9 between the semiconductor bodies 8 to form individual semiconductor components.

The optoelectronic semiconductor component produced in this way is illustrated in FIG. 12. The semiconductor body 8 of the optoelectronic semiconductor component has no growth substrate, but rather is advantageously connected at a side lying opposite the original growth substrate to a carrier body 14. The carrier body 14 can be optimized in particular with regard to its thermal and electrical properties, without having to satisfy the stringent requirements made of a growth substrate with regard to the crystal structure and the lattice constant. In particular, the carrier body 14 can be a germanium carrier body.

On account of the mirror layer 21, the sidewalls 10 of the semiconductor body 8 of the optoelectronic semiconductor component are advantageously highly reflective to the radiation emitted by the active layer 3 of the semiconductor body 8. Radiation emitted by the active layer 3 in the direction of the sidewalls 10 is advantageously reflected back by the mirror layer 11 and coupled out from the semiconductor body 8 if appropriate after one or a plurality of further reflections at the radiation exit side 18. Furthermore, radiation emitted in the direction of the carrier body 14 is advantageously reflected by the reflective contact layer 6 toward the radiation coupling-out area 18. The optoelectronic semiconductor component is therefore distinguished by improved coupling-out of light toward the radiation coupling-out side.

Further advantages and advantageous configurations of the method and of the optoelectronic semiconductor component correspond to the first example described above.

This disclosure is not restricted by the description on the basis of the examples. Rather, the disclosure encompasses any novel feature and also any combination of features, which in particular includes any combination of features in the appended claims, even if this feature or this combination itself is not explicitly specified in those claims or examples.

The invention claimed is:

1. A method for producing an optoelectronic semiconductor component comprising:
    growing an epitaxial layer sequence onto a growth substrate,
    applying a contact layer and a subsequent barrier layer to a surface of the epitaxial layer sequence which is remote from the growth substrate,
    structuring the epitaxial layer sequence to form individual semiconductor bodies by producing trenches in the epitaxial layer sequence,
    applying a dielectric layer at least to sidewalls of the semiconductor bodies which are uncovered in the trenches,
    applying a first part of a solder layer to the semiconductor bodies and into the trenches between the semiconductor bodies,
    applying a second part of the solder layer to a carrier body,
    connecting the semiconductor bodies at a side remote from the growth substrate to the carrier body by the solder layer, wherein the first part and the second part fuse together and the trenches between the semiconductor bodies are filled by the solder layer, and
    detaching the growth substrate.

2. The method according to claim 1, wherein the dielectric layer contains a silicon nitride or a silicon oxide.

3. The method according to claim 1, further comprising, after the dielectric layer has been applied, applying a mirror layer to the dielectric layer.

4. The method according to claim 3, wherein the mirror layer contains Ag, Pt, Al or Rh.

5. The method according to claim 3, further comprising applying a protective layer to the mirror layer.

6. The method according to claim 5, wherein the protective layer contains a silicon nitride, a silicon oxide, a metal or a metal compound.

7. The method according to claim 1, further comprising removing the solder layer from the trenches between the semiconductor bodies after the growth substrate has been detached.

8. The method according to claim 1, wherein the solder layer remains in the trenches between the semiconductor bodies after the growth substrate has been detached.

9. The method according to claim 1, further comprising separating the carrier body in the trenches to form individual semiconductor components.

* * * * *